United States Patent
Kastl et al.

(10) Patent No.: US 7,420,319 B2
(45) Date of Patent: Sep. 2, 2008

(54) PIEZOELECTRIC COMPONENT WITH PREDETERMINED BREAKING POINT AND METHOD FOR MANUFACTURING AND USING THE COMPONENT

(75) Inventors: Harald Johannes Kastl, Fichtelberg (DE); Carsten Schuh, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 128 days.

(21) Appl. No.: 11/202,763

(22) Filed: Aug. 12, 2005

(65) Prior Publication Data

US 2006/0181178 A1  Aug. 17, 2006

Related U.S. Application Data

(63) Continuation of application No. PCT/EP2005/051541, filed on Apr. 7, 2005.

(30) Foreign Application Priority Data

Jun. 29, 2004 (DE) .................. 10 2004 031 402

(51) Int. Cl.
*H01L 41/08* (2006.01)
(52) U.S. Cl. ........................ 310/363; 310/328
(58) Field of Classification Search .............. 310/328, 310/363, 364, 366
See application file for complete search history.

(56) References Cited

U.S. PATENT DOCUMENTS

| | | | | |
|---|---|---|---|---|
| 4,570,098 A | * | 2/1986 | Tomita et al. ............... | 310/346 |
| 5,237,239 A | * | 8/1993 | Inoue et al. ................. | 310/328 |
| 5,245,734 A | * | 9/1993 | Issartel ....................... | 29/25.35 |
| 6,208,026 B1 | | 3/2001 | Bindig et al. ................ | 257/718 |
| 6,483,227 B2 | * | 11/2002 | Murai et al. ................. | 310/328 |
| 7,208,862 B2 | * | 4/2007 | Florian et al. ............... | 310/366 |
| 2005/0116220 A1 | | 6/2005 | Riemer ........................ | 257/40 |

FOREIGN PATENT DOCUMENTS

| | | |
|---|---|---|
| DE | 197 04 389 A1 | 8/1998 |
| DE | 199 28 178 A1 | 8/2000 |
| DE | 100 26 635 A1 | 1/2002 |
| DE | 102 34 787 C1 | 10/2003 |
| JP | 58-196077 | 11/1983 |
| JP | 63-288075 | 11/1988 |
| JP | 03/138987 | 6/1991 |
| WO | WO 01/01499 A1 | 1/2001 |

OTHER PUBLICATIONS

International Search Report, PCT/EP2005/051541, 18 pp., Jun. 2005.

* cited by examiner

*Primary Examiner*—Mark Budd
(74) *Attorney, Agent, or Firm*—Baker Botts L.L.P.

(57) ABSTRACT

A piezoelectric component (1) has at least one monolithic piezo element (10) having an electrode layer (101), at least one further electrode layer (102), at least one piezoceramic layer (103) disposed between the electrode layers and at least one predetermined breaking point (100) which, in the event of mechanical overload of the piezo element, leads to the formation of a specific crack (110) in the monolithic piezo element, wherein the predetermined breaking point includes the electrode layer. The component is, for example, a piezoelectric actuator with a monolithic actuator body (2) in which piezo elements with predetermined breaking points and further piezo elements (11) without predetermined breaking points are arranged one on top of the other and sintered collectively.

15 Claims, 2 Drawing Sheets

PIEZOELECTRIC COMPONENT WITH PREDETERMINED BREAKING POINT AND METHOD FOR MANUFACTURING AND USING THE COMPONENT

CROSS-REFERENCE TO RELATED APPLICATIONS

This application is a continuation of co-pending International Application No. PCT/EP2005/051541 filed Apr. 7, 2005, which designates the United States and claims priority to German Application No. DE 10 2004 031 402.0 filed Jun. 29, 2004, the contents of which are hereby incorporated by reference in their entirety.

TECHNICAL FIELD

The invention relates to a piezoelectric component comprising at least one monolithic piezo element, a method for manufacturing the component and a use of the component.

BACKGROUND

The piezoelectric component is for example a piezoelectric actuator (piezo actuator) having a monolithic actuator body made of a plurality of piezo elements stacked one on top of the other. A piezo element consists of an electrode layer, at least one further electrode layer and at least one piezoceramic layer disposed between the electrode layers. The piezoceramic layer and the electrode layers of the piezo element are interconnected in such a way that an electric field is coupled into the piezoceramic layer by means of an electrical activation of the electrode layers. The coupled-in electric field causes the piezoceramic layer to deflect and consequently results in the deflection of the piezo element.

A described piezoelectric actuator is known for example from DE 100 26 635 A1. In the piezoelectric actuator the piezo elements are arranged one on top of the other in a stacking direction to form a monolithic actuator body. In this arrangement a plurality of electrode layers, which are referred to as internal electrodes, and a plurality of piezoceramic layers are stacked alternately one on top of the other and sintered collectively to form the monolithic actuator body. The piezoceramic layers consist of a lead zirconate titanate (Pb(Ti,Zr)O$_3$, PZT). The electrode layers consist of a silver-palladium alloy. For electrical contacting of the electrode layers, adjacent electrode layers in the stacking direction are brought to two lateral surface sections of the actuator body that are electrically insulated from each other. At each of these surface sections, the actuator body has a strip-shaped metallization.

In the area of the described surface sections of the actuator body, each of the piezo elements is piezoelectrically inactive. As a result of the alternating conducting of the electrode layers to the surface sections, an electric field is coupled into a piezoelectrically inactive area of the piezoelectric layer, the electric field differing markedly from the electric field which is coupled into a piezoelectrically active area of the piezoceramic layer. In contrast to the piezoelectrically inactive area, the piezoelectrically active area of the piezoceramic layer is located directly between the electrode layers of the piezo element.

During the electrical activation of the electrode layers, that is to say during the polarization of the piezoceramic and/or during operation of the piezo actuator, different deflections of the piezoceramic layer occur in the piezoelectrically active area and in the piezoelectrically inactive area due to the different electric fields. As a result thereof, mechanical stresses occur in the piezo element which can lead to what is referred to as a polarity crack transversely to the stacking direction or to the growth of an already existing crack. In this case the polarity crack can continue into the metallization applied to the respective surface section of the actuator body. This leads to an interruption of the electrical contacting of at least a part of the electrode layers of the actuator body.

To ensure that an existing polarity crack in the actuator body does not lead to a failure of the piezo actuator, in the case of the known piezo actuator a flexible electrical connecting element is attached in each case to the laterally applied metallizations of the actuator body. Each of the flexible connecting elements has a plurality of electrically conductive wires. Along the stacking direction of the actuator body the wires of a connector element are soldered onto one of the metallizations. The wires serve for the electrical contacting of the electrode layers of the actuator body (indirectly over the respective metallization). A rigid electrical connecting pin aligned along the stacking direction of the actuator body and to which the wires are soldered is provided for the electrical contacting of the wires of the connecting element. The contacting of the wires and the internal electrodes of the actuator body is ensured even when the deflection of the actuator body (expansion and contraction along the stacking direction) results in a polarity crack transversely to the stacking direction or, as the case may be, to the growth of an existing polarity crack transversely to the stacking direction.

However, a deflection of an existing polarity crack may occur during dynamic operation of the described piezoelectric actuator. The polarity crack grows in an uncontrolled manner. For example, the polarity crack grows parallel to or approximately parallel to the stacking direction rather than transversely to the stacking direction. Longitudinal cracks form in the actuator body. The uncontrolled growth of a polarity crack may be due to unfavorable intrinsic and/or extrinsic influencing variables. Intrinsic influencing variables relate, for example, to a structure of a piezoceramic layer and/or an electrode layer. The structure can lead to an anisotropic crack resistance within the respective layer. The crack resistance is different in different directions within the layer. Extrinsic influencing variables are based, for example, on an electrical leading edge during dynamic operation or on an inadequate clamping of the actuator body.

The uncontrolled growth of a polarity crack can result in the failure of the piezoelectric actuator. The reliability of the actuator is not guaranteed.

SUMMARY

The object of the present invention is therefore to provide a piezoelectric component consisting of monolithic piezo elements that is more reliable in comparison with the prior art.

To achieve this object, a piezoelectric component comprising at least one monolithic piezo element is specified, having an electrode layer, at least one further electrode layer, at least one piezoceramic layer disposed between the electrode layers and at least one predetermined breaking point which, in the event of mechanical overload of the piezo element, leads to the formation of a specific crack in the monolithic piezo element, the predetermined breaking point comprising the electrode layer.

To achieve this object, a method for manufacturing the component is also specified, comprising the following method steps: a) provide a ceramic green sheet exhibiting a piezoceramic, having a main area and a further main area facing away from the main area, b) dispose electrically conductive material on the main area and dispose further electrically conductive material on the further main area of the ceramic green sheet and c) jointly sinter the ceramic green sheet and the electrically conductive materials, the electrode layer being formed from the electrically conductive material, the further electrode layer being formed from the further electrically conductive material, and the piezoceramic layer of the piezo element being formed from the ceramic green sheet.

The predetermined breaking point is a piezo element component which, in the event of overload, similar to a fuse, is destroyed by formation of a crack or, as the case may be, through growth of an existing crack. At the same time the crack is essentially restricted to the predetermined breaking point. Only the predetermined breaking point is destroyed, not the entire piezo element or other regions of the piezo element. The crack is locally restricted to the predetermined breaking point and does not propagate into other areas of the piezo element. By this means it is possible to control the formation of a crack or, as the case may be, the growth of a crack.

The crack leads to a fracture of the monolithic piezo element at the predetermined breaking point. The fracture is a process which puts an end to a mechanically induced deformation of a material. The fracture is in particular a brittle fracture. The brittle fracture can be caused by creeping (creep fracture) and in particular by fatigue (fatigue fracture). Fatigue is understood to mean a failure of materials as a result of progressive crack growth, caused by repeated (mechanical) stress cycles.

An essential component of the piezo element is involved at the predetermined breaking point, namely one of the electrode layers. This means that no additional component must be introduced in order to form the predetermined breaking point of the piezo element. The additional component of the piezo element could lead to a reduction in the piezoelectrically active volume of the piezo element. An additional component of the kind would be, for example, a ceramic safety layer of the piezo element, the layer being made of a piezoelectrically inactive ceramic material characterized by a lower crack resistance compared with the piezoceramic of the piezoceramic layer.

In a special embodiment the predetermined breaking point is formed by the electrode layer and/or by an interface between the electrode layer and the piezoceramic layer.

In particular in a case where the predetermined breaking point is formed by the electrode layer, a crack resistance of the electrode layer is less than a further crack resistance of the further electrode layer. This means that a fracture resistance of an electrode material of the electrode layer is less than a fracture resistance of a further electrode material of the further electrode layer. Equally, the fracture resistance of the electrode material is less than a fracture resistance of the piezoceramic layer. The lower fracture resistance of the electrode material compared with the further electrode material and with the piezoceramic results in the predetermined breaking point being present in the electrode layer. The electrode layer is the weakest link. In the event of mechanical overload a crack will occur in the electrode layer.

In a case where the predetermined breaking point is formed by the interface between the electrode layer and the piezoceramic layer, an adhesive bond mating the electrode layer and the piezoceramic layer with each other is weaker than a further adhesive bond joining the further electrode layer and the piezoceramic layer to each other. The interface between the electrode layer and the piezoceramic layer is the weakest link. In the event of mechanical overload a crack will occur at the interface between the electrode layer and the piezoceramic layer.

In a special embodiment, an electrode material of the electrode layer and a further electrode material of the further electrode layer differ from each other in order to obtain different crack resistances or, as the case may be, adhesive bonds. The electrode layers consist of different electrode materials. In this case, the electrode material and the further electrode material differ from each other in particular in terms of their chemical composition and/or in their material structure. The material structure relates, for example, to a structure (e.g. core shell structure) and a size or, as the case may be, size distribution of grains of the electrode material as well as a texture of the electrode material. The texture relates, for example, to a porosity of the electrode material. A different porosity of the electrode material can be produced for example through the use of different metallic pastes in the manufacture of the piezo element. In order to form the electrode layers, the metallic pastes are printed onto one or more electrode layers. The different metallic pastes are characterized for example by different binder and/or solid material contents. Substances which decompose during sintering, for example, are used as binders and/or solid materials. Substances of the kind consist, for example, of carbon or hydrocarbons. For example, the metallic pastes contain plastic beads. An average particle diameter is 0.1 μm to 2.0 μm. During debindering or, as the case may be, sintering, the plastic beads burn out, leaving pores in the electrode layers produced in the sintering process. Different proportions of pores and/or pore sizes lead to different crack resistances and adhesive bonds.

The chemical composition of the electrode substances relates in particular to an electrically conductive electrode material of the electrode substances. The electrode layers have different electrically conductive electrode materials. The different electrode materials can consist of different elements. For example, the electrode material of the electrode layer is platinum and the further electrode material of the further electrode layer is a silver-palladium alloy. Platinum is characterized for example by a markedly poorer adhesion to lead zirconate titanate in comparison with a silver-palladium alloy. This results in a weaker adhesive bond between the electrode layer made of platinum and the piezoceramic layer made of lead zirconate titanate in comparison with the adhesive bond of the further electrode layer containing the silver-palladium alloy and the piezoceramic layer.

However, it is also conceivable that the different electrode materials of the electrode substances originate from the same material system rather than from different material systems. The electrode materials have identical elements. However, the element proportions of the elements differ from electrode material to electrode material. For example, the electrically conductive electrode material of the electrode substance and the electrically conductive electrode material of the further electrode substance are in each case a silver-palladium alloy, albeit with different element proportions of silver and palladium.

The different chemical composition of the electrode materials can also relate to an ancillary substance added to the electrically conductive electrode material, as well as to the electrically conductive electrode material. For example, the electrically conductive electrode material of the two electrode layers is identical, but one of the electrode layers consists only of the electrically conductive electrode material, whereas the other electrode layer consists of a composite material comprising the electrically conductive electrode material and the ancillary substance.

For example, the piezoceramic of the piezoceramic layer is a lead zirconate titanate. Lead oxide (PbO) is released during the sintering of lead zirconate titanate. Using zirconate titanate ($(Ti,Zr)O_2$, ZTO) as an ancillary substance added to the electrode material causes binding of the lead oxide of the lead zirconate titanate that is released during sintering. Lead zirconate titanate is formed, thereby strengthening the adhesive bond at the interface to the piezoceramic layer made of lead zirconate titanate. In order to increase the adhesive bond it is also possible to use lead zirconate titanate directly as the ancillary substance. The further electrode layer is preferably furnished with the cited ancillary substances. This results in an improved adhesive bond of the further electrode layer to the piezoceramic layer. The interface between the electrode layer without such ancillary substances becomes the predetermined breaking point.

In a further embodiment an electrode structure of the electrode layer and a further electrode structure of the further electrode layer differ from each other. By means of differently structured electrode layers it is ensured that the electrode layer has a lower crack resistance than the further electrode layer or, as the case may be, that a weaker adhesive bond exists between the electrode layer and the piezoceramic layer than between the further electrode layer and the piezoceramic layer. Toward that end, the electrode layers are structured for example in the shape of a grid or similar to an aperture mask. Different electrode structures of the kind can be obtained for example during printing of the ceramic green sheets with the metallic pastes by means of different printing designs.

Crack resistance and adhesive bond can also be influenced by different layer thicknesses of the electrode layers. Thus, in a special embodiment, the electrode structure relates to one electrode layer thickness and the further electrode structure to a further electrode layer thickness, each of the electrode layers having an approximately equal electrode layer thickness throughout. It is also conceivable that the electrode layer thicknesses are different within an electrode layer. For example, a gradient of the electrode layer thickness exists along a lateral extension of the electrode layer or the further electrode layer.

In a special embodiment a plurality of piezo elements are arranged into a monolithic, stack-shaped actuator body with one stacking direction. The piezo elements are stacked one on top of the other to form the actuator body. In this arrangement the actuator body may only be built from piezo elements with one predetermined breaking point in each case. In a special embodiment the piezo element and at least one further piezo element are arranged into a monolithic, stack-shaped actuator body with one stacking direction, the further piezo element having at least two further electrode layers and at least one further piezoceramic layer between the further electrode layers. The further piezoceramic layer may consist of a different piezoceramic material from the piezoceramic layer of the piezo element with the predetermined breaking point. Preferably, however, the piezo element and the further piezo element have the same piezoceramic material. Since the further electrode layers are identical, no predetermined breaking point is implemented in the further piezo element, at least in respect of the electrode layers. Substantially more further piezo elements without predetermined breaking point than piezo elements with predetermined breaking point are preferably arranged one on top of the other. This results in an actuator body in which a small number of predetermined breaking points are present. These predetermined breaking points are distributed over the actuator body along the stacking direction.

In a further embodiment a plurality of the piezo elements and a plurality of the further piezo elements are arranged to form the monolithic, stack-shaped actuator body in such a way that adjacent piezo elements have at least one common electrode layer in each case and the common electrode layers are brought in the stacking direction of the actuator body alternately to at least two lateral surface sections of the actuator body that are electrically insulated from one another. One lateral surface section of the actuator body is formed for example by a side face or by an edge of the actuator body on which a metallization track is deposited. An actuator body having a multi-layer capacitor structure is present. Within this multi-layer capacitor structure the electrode layers are led alternately to surface sections that are electrically insulated from one another.

In a special embodiment a plurality of piezo elements are arranged to form the actuator body with a number of predetermined breaking points in such a way that along the stacking direction of the actuator body the predetermined breaking points have a gradient in respect of the mechanical overload at which a crack is formed in each case. A resistance gradient is present. This embodiment is advantageous when a corresponding gradient of the mechanical loading of the actuator body occurs along the stacking direction. The above specified possibilities of influencing the resistance of the individual electrode layers and the interfaces can be referred to in order to produce the resistance gradient. Furthermore, the formation of the resistance gradient can be assisted by targeted process control during the manufacture of the actuator body. Thus, for example, the formation of an amorphous lead palladium oxide intermediate layer between the electrode layer and the piezoceramic layer can be induced during the common sintering of lead zirconate titanate and electrode material of a silver-palladium alloy.

In a further embodiment the predetermined breaking point of at least one of the piezo elements of the actuator body is designed in such a way that a crack occurring in the piezo element splits the actuator body into at least two sub-stacks and the electrode layers of the respective sub-stack, which are brought to a common lateral surface section, remain electrically contacted with the aid of an electrical sub-connecting element. Electrical and mechanical contact between the sub-connecting element and the lateral surface section is achieved with the aid of an electrically conductive connecting means. The electrically conductive connecting means is for example a conductive adhesive or a solder. The sub-connecting element is glued or soldered to the surface section. Connecting by means of welding is also conceivable.

The electrical sub-connecting element is preferably a flexible sub-connecting element. This enables the sub-connecting element to follow the expansion and contraction of the sub-stack of the actuator body.

The flexible sub-connecting element is formed for example by a structured electrically conductive foil. In a special embodiment the electrical sub-connecting element has at least one electrically conductive wire. The sub-connecting element consists, for example, of a plurality of wires or a wire mesh. Also conceivable in particular is a sub-connecting element in the form of a single wire, the wire being dimensioned such that a current-carrying capacity necessary for driving the electrode layers of the sub-stack that are to be contacted is guaranteed.

Furthermore, the wire or, as the case may be, the wire mesh and the connection to the lateral surface section of the actuator body are designed to take account of the mechanical stresses that are likely during the expansion and contraction of the sub-stack. The mechanical stresses can differ from sub-stack to sub-stack. Thus, different requirements result with regard to the sub-connecting element and its connection to the surface section. In the case of a sub-stack of a static area of the actuator body in which only a slight deflection of the sub-stack is provoked by the activation of the electrode layers, it is sufficient, for example, to use a single and at the same time relatively thick wire for the electrical contacting of the electrode layers. On the other hand it can be advantageous to use a plurality of thin and therefore more flexible wires in a sub-stack of an area of the actuator body in which a large deflection occurs.

In order to supply electrode layers of different sub-stacks with the same electrical potential, the corresponding sub-connecting elements are combined to form a common connecting element. For this purpose, the wires are for example soldered or glued to a common rigid electrical connecting pin in an electrically conducting and frictional manner with the aid of a further connecting means. The electrical connecting element or, as the case may be, the electrical sub-connecting elements are present as a wire harp.

With regard to the method, a metallic paste with a different composition in each case is used for arranging the electrically conductive material and/or for arranging the further electrically conductive material. The metallic paste is printed onto one or more ceramic green sheets. A screen printing technique, for example, is used for the printing. In this process the electrode material and/or the further electrode material can be applied differently structured in each case, for example with a different layer thickness. Preferably, different electrode material is printed. For example, the electrode material consists of a silver-palladium alloy, whereas the electrode material of the further electrode layer consists of a platinum alloy. Since these materials bind more or less tightly to the piezo-ceramic layer created during the sintering, interfaces with a different adhesive bonding strength are produced as a result.

The piezoelectric component described, in particular the piezoelectric actuator having the actuator body in monolithic multi-layer format, is preferably used for controlling a valve and in particular for controlling an injection valve of an internal combustion engine.

To sum up, the following substantial advantages are produced as a result of the invention:

With the aid of the predetermined breaking points it is possible to successfully control and limit crack formation and crack growth (in particular of longitudinal cracks) in a piezoelectric component. The result is a more reliable component in comparison with the prior art.

Owing to the fact that the predetermined breaking points are implemented with integration of the electrode layers, a piezoelectric component with the maximum possible piezoelectrically active volume is available.

The control of the cracks results in a simplification of the electrical contacting of the electrode layers of the component.

The method for manufacturing the piezoelectric component with the predetermined breaking points can be integrated into existing manufacturing processes for piezo actuators.

BRIEF DESCRIPTION OF THE DRAWINGS

The invention will be described in more detail below with reference to an exemplary embodiment and the associated figures. The figures are schematic and do not represent illustrations that are true to scale.

DETAILED DESCRIPTION

Figure 3:
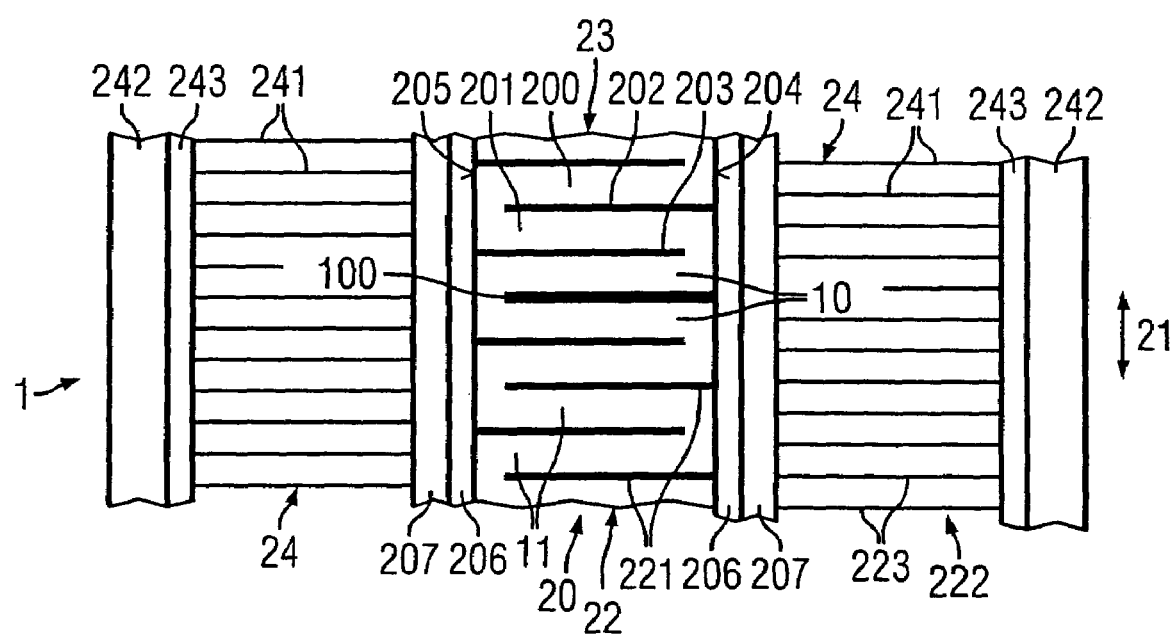
FIG. 3 shows a section of a piezoelectric component in the form of a piezo actuator with an actuator body in monolithic multi-layer format from the side.

The piezoelectric component 1 is a piezoelectric actuator having an actuator body 20 in monolithic multi-layer format (FIG. 3). A basic area of the actuator body 20 is square.

Figure 1:
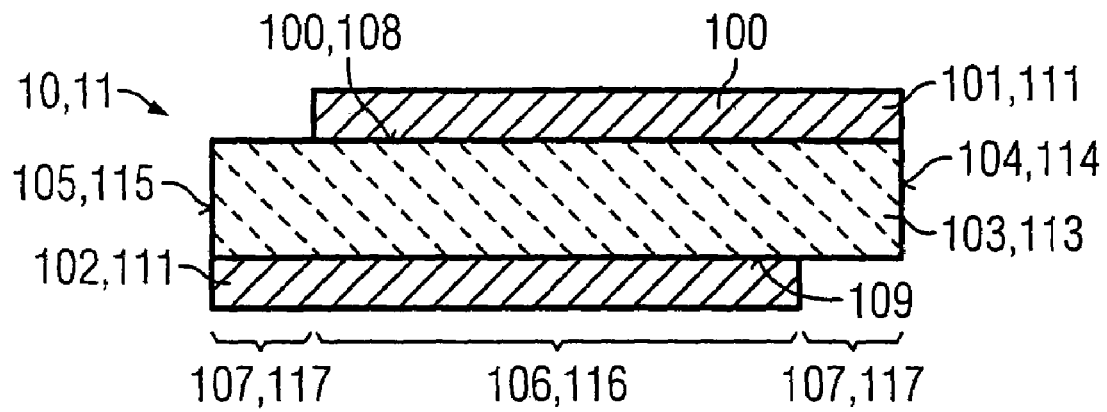
FIG. 1 shows a piezo element and a further piezo element in lateral cross-section in each case.

The actuator body 20 consists of piezo elements 10 and further piezo elements 11 stacked one on top of the other (FIG. 1). In this arrangement a piezo element 10 consists of an electrode layer 101, at least one further electrode layer 102 and at least one piezoceramic layer 103 disposed between the electrode layers 101 and 102. The piezoceramic layer 103 is made of a lead zirconate titanate.

The electrode layers 101 and 102 are arranged on the main areas of the piezoceramic layer 103 in such a way that an electric field is coupled into the piezoceramic layer 103 by the electrical activation of the electrode layers 101 and 102, thereby causing the piezoceramic layer 103 to deflect and consequently resulting in the deflection of the piezo element 10.

To achieve the electrical contacting, the electrode layers 101 and 102 are brought to two lateral surface sections 104 and 105 of the piezo element 10 that are electrically insulated from each other. At these surface sections 104 and 105, the two electrode layers 101 and 102 are in each case electrically contacted with an electrical connecting element (not shown in FIG. 1). As a result of the electrode layers 101 and 102 being conducted to the mutually separate surface sections 104 and 105, the piezo element 10 has a piezoelectrically active area 106 and at least two piezoelectrically inactive areas 107.

In principle the further piezo elements 11 are identical in structure to a piezo element 10. A further piezoceramic layer 113 made of the lead zirconate titanate is disposed between the further electrode layers 111 of the further piezo element 11. The electrode layers 111 are brought to the lateral surface sections 114 and 115 of the further piezo element 11 and electrically contacted at those points. The electrical activation of the further electrode layers 111 results in the deflection of the further piezo element 11. The further piezo element is similarly embodied such that a further piezoelectrically active area 116 and piezoelectrically inactive areas 117 of the further piezo element result.

Piezo elements 10 and further piezo elements 11 are disposed with respect to the monolithic, stack-shaped actuator body 20 in such a way that adjacent piezo elements 200 and 201 have common electrode layers 202 and 203 which are brought in the stacking direction 21 of the actuator body 20 alternately to two lateral surface sections 204 and 205 of the actuator body 20 that are electrically insulated from each other. The actuator body 20 therefore consists of a plurality of piezoceramic layers and electrode layers that are stacked on top of one another in alternation.

The lateral surface section 204 of the actuator body 20 is formed by the lateral surface sections 104 and 114 of the piezo elements 10 and the further piezo elements 11. The further lateral surface section 205 of the actuator body 20 is formed by the further lateral surface sections 105 and 115 of the piezo elements 10 and the further piezo elements 11. To achieve electrical contacting of the electrode layers 101 and the further electrode layers 102 or, as the case may be, 111, metallization tracks 206 are deposited on the lateral surface sections 204 and 205 of the actuator body 20, electrical connecting elements 24 being soldered to the metallization tracks 206 via solder tracks 207. Each of the electrical connecting elements 24 consists of electrically conductive wires 241, the wires 241 being soldered to a common, rigid electrical connecting pin 242 (via the solder tracks 243) in order to allow the same electrical potential to be applied to the electrode layers. As an alternative thereto, each of the connecting elements 24 consists of a structured, electrically conductive metallic foil.

The difference between a piezo element 10 and a further piezo element 11 is that the electrode layer 101 of the piezo element 10 has a predetermined breaking point 100. In contrast, the further electrode layers 111 of the further piezo element 11 have no predetermined breaking point 100 auf.

Figure 2A:
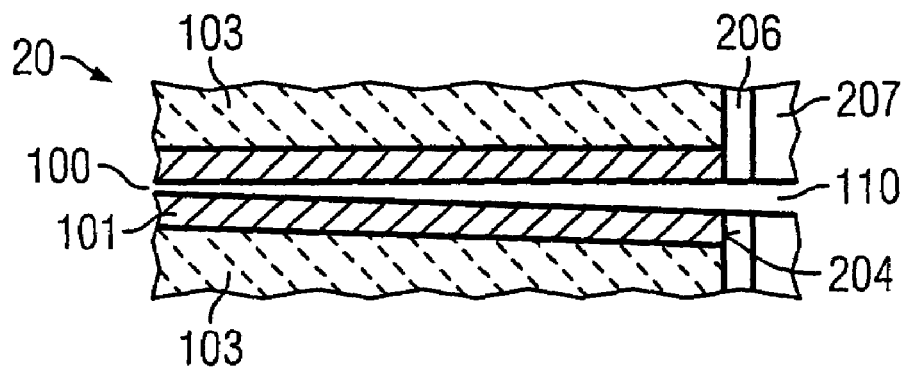
FIGS. 2A and 2B show a section of a predetermined breaking point on or in which a crack has occurred.

In a first embodiment, the predetermined breaking point 100 is formed exclusively by the electrode layer 101 of a piezo element 10 (FIG. 2A). For that purpose, a crack resistance of the electrode layer 101 is less than a crack resistance of the further electrode layer 102 of the piezo element 10 or, as the case may be, a crack resistance of the piezoceramic layer 103 of the piezo element. Similarly, the crack resistance of the electrode layer 101 is less than the crack resistance of the further electrode layers 111 and the piezoceramic layers 113 of the further piezo elements 11. This ensures that in the event of mechanical overload of the actuator body 20 a crack 110 can occur precisely at the predetermined breaking point 100 of the piezo element 10. The different crack resistances also ensure that the crack 110 essentially remains at the predetermined breaking point 100. Although the crack 110 can propagate into the metallization track 206 deposited on the lateral surface section 204 of the actuator body 20 and into the applied solder track 207, it cannot spread into other areas of the piezo element 10 or the actuator body 20. The crack 110 remains locally restricted to the predetermined breaking point 100.

Figure 2B:
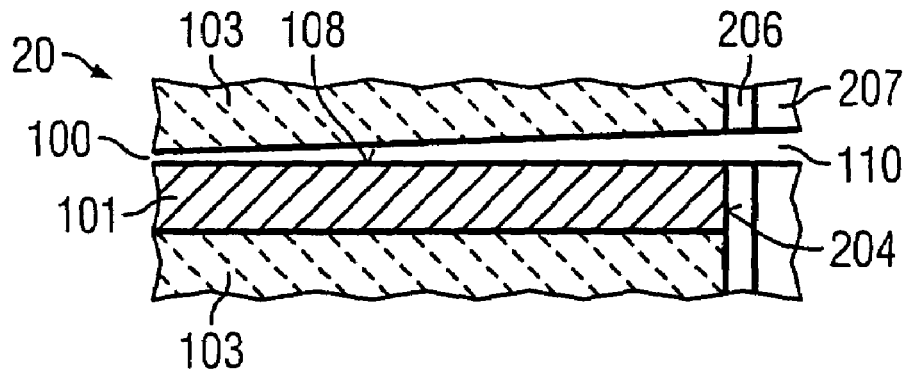

In a further embodiment the predetermined breaking point 100 is formed by an interface 108 between the electrode layer 101 and the adjacent piezoceramic layer 103 of the piezo element 10 (FIG. 2B). The predetermined breaking point 100 is produced as a result of the fact that an adhesive bond mating the electrode layer 101 and the piezoceramic layer 103 with each other is weaker than the adhesive bond between the piezoceramic layer 103 and the further electrode layer 102. Similarly, the adhesive bond mating the electrode layer 101 and the piezoceramic layer 103 with each other is weaker than the adhesive bond between the further electrode layers 111 and the further piezoceramic layers 113 of the further piezo elements 11. The weaker adhesive bond ensures that in the event of mechanical overload of the actuator body 20 the crack 110 essentially occurs only at the interface 108. At the same time it is ensured that the adjacent piezoceramic layers 103 have a relatively high crack resistance and therefore a crack growth or, as the case may be, a crack propagation into this piezoceramic layer 103 is prevented.

According to a first embodiment, in order to achieve different crack resistances or, as the case may be, adhesive bonds, electrode layers 101, 102 or 111 with different electrode materials are used. According to an alternative embodiment, the electrode layers have different electrode structures.

According to a first exemplary embodiment in relation to the actuator body 20, a single electrode layer 101 with a predetermined breaking point 100 is present. The actuator body 20 consists of two adjacent piezo elements 10 with the predetermined breaking point 100 and a plurality of further piezo elements 11 which have no predetermined breaking point 100. In the event of mechanical overload of the actuator body 20, a crack forms at the predetermined breaking point 100. As a result the actuator body 20 is subdivided into two sub-stacks 22 and 23. Upon occurrence of the crack 110, which extends into the metallization track 206 and the solder track 207, the electrode layers 221 of one sub-stack 22, which are brought to a common surface section 204 of the actuator body 20 in each case, remain electrically contacted with the electrically conductive wires 223 of an electrical sub-connecting element 222.

In this arrangement a single sub-connecting element 222 for a common surface section 204 of the individual sub-stacks 22 is sufficient to guarantee the electrical contacting. The sub-connecting element 222 required for this can have only a single, correspondingly dimensioned electrically conductive wire 223. As an alternative thereto, each of the sub-connecting elements 222 consists of a plurality of wires 223 or of a structured metallic foil. The wire or, as the case may be, wires and the structured electrically conducting foil are embodied in such a way that a current-carrying capacity necessary for driving the electrode layers of the sub-stack 22 of the actuator body 20 is guaranteed.

According to a further exemplary embodiment in relation to the actuator body 20, a plurality of predetermined breaking points 100 are distributed over the actuator body 20 in the stacking direction 21. The predetermined breaking points 100 lead to the actuator body 20 being subdivided into a plurality of sub-stacks 22 and 23. Corresponding sub-connecting elements 222 are provided for each of the sub-stacks 22 and 23.

In a development of an actuator body 20 having a plurality of predetermined breaking points 100, different mechanical overloads lead to the formation of cracks 110 at the predetermined breaking points 100. In this arrangement the predetermined breaking points 100 are embodied in such a way that a gradient is present along the stacking direction 21 of the actuator body 20 in respect of the critical overload at which the formation of cracks 110 occurs. Toward that end, the associated electrode layers exhibit different crack resistances and/or the adhesive bonds joining the electrode layers to adjacent piezoceramic layers are different.

What is claimed is:

1. A piezoelectric component (1) comprising at least one monolithic piezo element (10), comprising:
   an electrode layer (101),
   at least one further electrode layer (102),
   at least one piezoceramic layer (103) disposed between the electrode layers (101, 102), and
   at least one predetermined breaking point (100) which, in the event of mechanical overload of the piezo element (10), leads to the formation of a specific crack (110) in the monolithic piezo element (10), wherein
   the predetermined breaking point (100) includes the electrode layer (101), wherein an electrode material of the electrode layer (101) and a further electrode material of the further electrode layer (102) are different.

2. A component according to claim 1, wherein the predetermined breaking point (100) is formed by the electrode layer (101) and/or by an interface (108) between the electrode layer (101) and the piezoceramic layer (103).

3. A component according to claim 2, wherein die predetermined breaking point (100) is formed by the electrode layer (101) and a crack resistance of the electrode layer (101) is less than a further crack resistance of the further electrode layer (102).

4. A component according to claim 2, wherein the predetermined breaking point (100) is formed by the interface (108) between the electrode layer (101) and the piezoceramic layer (103) and an adhesive bond mating the electrode layer (101) with the piezoceramic layer (103) at the interface (108) is weaker than a further adhesive bond between the further electrode layer (102) and the piezoceramic layer (103) at a further interface (109).

5. A component according to claim 1, wherein the electrode material and the further electrode material differ in terms of their chemical composition and/or in their material structure.

6. A component according to claim 5, wherein the chemical composition relates to an electrically conductive electrode material.

7. A component according to claim 5, wherein the chemical composition relates to an ancillary substance in addition to the electrically conductive electrode material.

8. A piezoelectric component (1) comprising at least one monolithic piezo element (10), comprising:
an electrode layer (101),
at least one further electrode layer (102),
at least one piezoceramic layer (103) disposed between the electrode layers (101, 102), and
at least one predetermined breaking point (100) which, in the event of mechanical overload of the piezo element (10), leads to the formation of a specific crack (110) in the monolithic piezo element (10), wherein
the predetermined breaking point (100) includes the electrode layer (101), wherein an electrode structure of the electrode layer (101) and a further electrode structure of the further electrode layer (102) differ from each other.

9. A component according to claim 8, wherein the electrode structure relates to an electrode layer thickness and the further electrode structure relates to a further electrode layer thickness.

10. A piezoelectric component (1) comprising at least one monolithic piezo element (10), comprising:
an electrode layer (101),
at least one further electrode layer (102),
at least one piezoceramic layer (103) disposed between the electrode layers (101, 102), and
at least one predetermined breaking point (100) which, in the event of mechanical overload of the piezo element (10), leads to the formation of a specific crack (110) in the monolithic piezo element (10), wherein
the predetermined breaking point (100) includes the electrode layer (101), wherein a plurality of piezo elements (10) is arranged to form a monolithic, stack-shaped actuator body (20) with one stacking direction (21), wherein a plurality of piezo elements (10) are arranged to form an actuator body (20) with a number of predetermined breaking points (100) in such a way that the predetermined breaking points (100) have a gradient along the stacking direction (21) of the actuator body (20) in respect of the mechanical overload at which a crack (110) will occur in each case.

11. A component according to claim 10, wherein the piezo element (10) and at least one further piezo element (11) are arranged to form a monolithic, stack-shaped actuator body (20) with one stacking direction (21), wherein the further piezo element (11) has at least two further electrode layers (111) and at least one further piezoceramic layer (113) disposed between the further electrode layers (111).

12. A component according to claim 10, wherein a plurality of the piezo elements (10) and a plurality of the further piezo elements (11) are arranged to form the monolithic, stack-shaped actuator body (20) in such a way that
adjacent piezo elements (200, 201) have at least one common electrode layer (202, 203) in each case and
the common electrode layers (202, 203) in the stacking direction (21) of the actuator body (20) are brought alternately to at least two lateral surface sections (204, 205) of the actuator body (20) that are electrically insulated from one another.

13. A component according to claim 10, wherein the predetermined breaking point (100) of at least one of the piezo elements (10) of the actuator body (20) is embodied in such a way that a crack (110) occurring in the piezo element (10) subdivides the actuator body (20) into at least two sub-stacks (22, 23) and the electrode layers (221) of the respective sub-stack (22), which are brought to a common lateral surface section (204), remain electrically contacted with the aid of an electrical sub-connecting element (222).

14. A component according to claim 13, wherein the electrical sub-connecting element (222) has at least one electrically conductive wire (223).

15. A component according to claim 13, wherein the electrical sub-connecting element (222) has a structured electrically conductive foil.

* * * * *